United States Patent

Bajkowski et al.

[11] Patent Number: 5,876,507
[45] Date of Patent: Mar. 2, 1999

[54] FLUID TREATMENT DEVICE AND METHOD

[75] Inventors: David John Bajkowski, Hallstead, Pa.; Mark Alan Brown, Whitney Point, N.Y.; Richard Emerson Cole, Port Crane, N.Y.; Daniel Stephen Potsko, Endwell, N.Y.

[73] Assignee: International Business Machines Corporation, Armonk, N.Y.

[21] Appl. No.: 884,883

[22] Filed: Jun. 30, 1997

[51] Int. Cl.⁶ ..................................................... B08B 3/12
[52] U.S. Cl. ................................... 134/1; 134/1; 134/184
[58] Field of Search ...................... 134/1, 184; 366/127

[56] References Cited

U.S. PATENT DOCUMENTS

| | | | |
|---|---|---|---|
| 2,702,260 | 2/1955 | Massa . | |
| 2,828,231 | 3/1958 | Henry . | |
| 2,985,003 | 5/1961 | Gelfand et al. . | |
| 3,229,702 | 1/1966 | Murdoch, Jr. | ............................. 134/1 X |
| 3,448,747 | 6/1969 | Isaacson | ................................... 134/1 X |
| 3,937,236 | 2/1976 | Runnells . | |
| 4,131,438 | 12/1978 | Iwahashi et al. | ............................. 134/1 |
| 4,854,337 | 8/1989 | Bunkenburg et al. . | |
| 5,143,106 | 9/1992 | Bannon . | |
| 5,377,709 | 1/1995 | Shibano | ................................... 134/184 |
| 5,427,622 | 6/1995 | Stanasolovich et al. . | |
| 5,456,759 | 10/1995 | Stanford, Jr. et al. . | |
| 5,512,335 | 4/1996 | Miller et al. . | |

OTHER PUBLICATIONS (Problems 10.20,10.21) "Intensity Distribution for Interferences with Diffraction from N Identical Slits".

*Primary Examiner*—Arlen Soderquist
*Attorney, Agent, or Firm*—Pollock, Vande Sande & Priddy; Lawrence R. Fraley

[57] ABSTRACT

A fluid treating device with at least one chamber, a plurality of ultrasonic transducers for imparting ultrasonic waves through fluid when present in the at least one chamber; a screen located in the at least one chamber wherein the screen is coated with a dielectric material. The coated screen diffuses the ultrasonic waves and enhances uniform treatment. The fluid treating device is useful for treatments such as cleaning, degreasing, plating or etching articles such as ceramic substrates.

20 Claims, 1 Drawing Sheet

FLUID TREATMENT DEVICE AND METHOD

DESCRIPTION

1. Technical Filed

The present invention is concerned with fluid treatment devices and particularly those adopted for treating articles such as substrates or the like. Even more particularly, the present invention is related to such devices wherein vibrational, e.g. ultrasonic, energy is imparted to the articles being treated. The present invention is especially related to fluid treating devices that exhibit improved uniformity of treatment and significantly reduce the occurrence of hot spots. In addition, the present invention is concerned with the method of treating an article with a fluid such as cleaning, degreasing, plating or etching articles such as ceramic substrates.

2. Background of the Invention

There are several known devices designed for treating substrates (e.g. those used as base elements for such electronic components as ceramic modules, printed circuit boards, and the like). Examples are shown in U.S. Pat. Nos. 4,142,010 (Pipkin et al), 4,152,153 (Jackson et al), 4,299,186 (Pipkin et al), 4,387,124 (Pipkin) and 4,836,133 (Wohrle). See also International Business Machines (IBM) Corporation Technical Disclosure Bulletin (TDB), Vol. 23, No. 4 (September 1980) at pages 1362 and 1363. More recent examples are defined in U.S. Pat. Nos. 5,063,951 (Bard et al) and 5,289,639 (Bard et al), both assigned to the assignee of the present invention. With particular regard to U.S. Pat. No. 5,289,639, a fluid jet injector member is defined which includes strategically positioned apertures (jet injectors) for directing fluid jets onto a designated substrate.

In addition to the above, there are known such fluid treatment devices wherein ultrasonic energy is utilized, e.g. to enhance the treatment process. Examples are shown in U.S. Pat. Nos. 4,501,285 (Irwin et al), 4,849,769 (Dressier), 4,979,994 (Dussault et al), 5,037,208 (Dussault), 5,148,823 (Bran) and 5,203,798 (Watanabe et al). Ultrasonic vibration is also described in IBM TDB Vol. 27, No. 11, (April 1985), page 6395 (wave soldering), and in the following published Japanese documents: (1) JA 0044927 (February 1991), Appl. No. 64-181025 (semiconductor substrate cleaning); and (2) JP 404206636 (July 1992), Appl. No. 2-330177 (semiconductor device cleaning) . In such devices, the ultrasonic source (e.g. transducer) has typically been secured to (and thus operatively connected to) the fluid container to cause vibration thereof or has been immersed in a container of substantially stationary fluid.

Moreover, an enhanced treatment has been developed as described in U.S. Pat. No. 5,512,335 (Miller et al) and assigned to the assignee of this application, disclosure of which is incorporated herein by reference, which utilizes a partly submerged vibrational structure (e.g. ultrasonic horn) that is not physically connected to the housing of the device but instead substantially only exposed to the vibrating fluid. The invention therein thus does not require (or desire) housing vibration.

Although using ultrasonic energy results in enhanced fluid treatment, a problem has been observed in its use.

In particular, by way of example, it was observed that the perchloroethylene degreaser, used to deflux substrates after soldering, was damaging or destroying the solderred joints. The ultrasonic horns across the bottom of the device focused energy creating hot spots, thereby causing solder joints to be pitted and, in some instances, completely destroyed. Accordingly, an object of the present invention is to at least significantly reduce, if not eliminate, this problem of hot spots or non-uniform treatment.

SUMMARY OF THE INVENTION

The present invention renders the fluid treatment more uniform and significantly reduces, if not eliminating, hot spots. The present invention accomplishes this without adversely affecting the level of treatment desired.

In particular, the present invention is concerned with a fluid treating device that contains a housing defining at least one chamber therein. Means are provided in the chamber for suspending articles to be treated by the treating device. A plurality of ultrasonic transducers are located adjacent the chamber for imparting ultrasonic waves through fluid when present in the chamber for impinging on the articles to be treated. A screen is located in the chamber and intermediate to the ultrasonic transducers and the means for suspending the articles to be treated. According to the present invention, the screen is coated with a dielectric material to thereby diffuse the ultrasonic waves and enhance uniform treatment of the articles.

In addition, the present invention is concerned with a method for treating an article with fluid. The method of the present invention comprises providing a housing defining at least one chamber therein; providing fluid to the chamber and suspending the article to be treated in the chamber. In addition, a plurality of ultrasonic transducers are provided adjacent the chamber for imparting ultrasonic waves through the fluid for impinging on the article to be treated. The ultrasonic waves are diffused to thereby enhance uniform treatment of the article by providing a screen in the chamber and intermediate between the ultrasonic transducers and article being treated. It is essential to the practice of the present invention that the screen be coated with a dielectric material.

By the term treatment (or treating) of substrates as used herein, is meant to include functions such as coating, cleaning, degreasing, etching, chemical reaction, as well as others such as plating. One particular use of the present invention is to facilitate degreasing in substrates such as ceramic substrates such as using a solvent such as perchloroethylene.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BEST AND VARIOUS MODES FOR CARRYING OUT INVENTION

Figure 1:
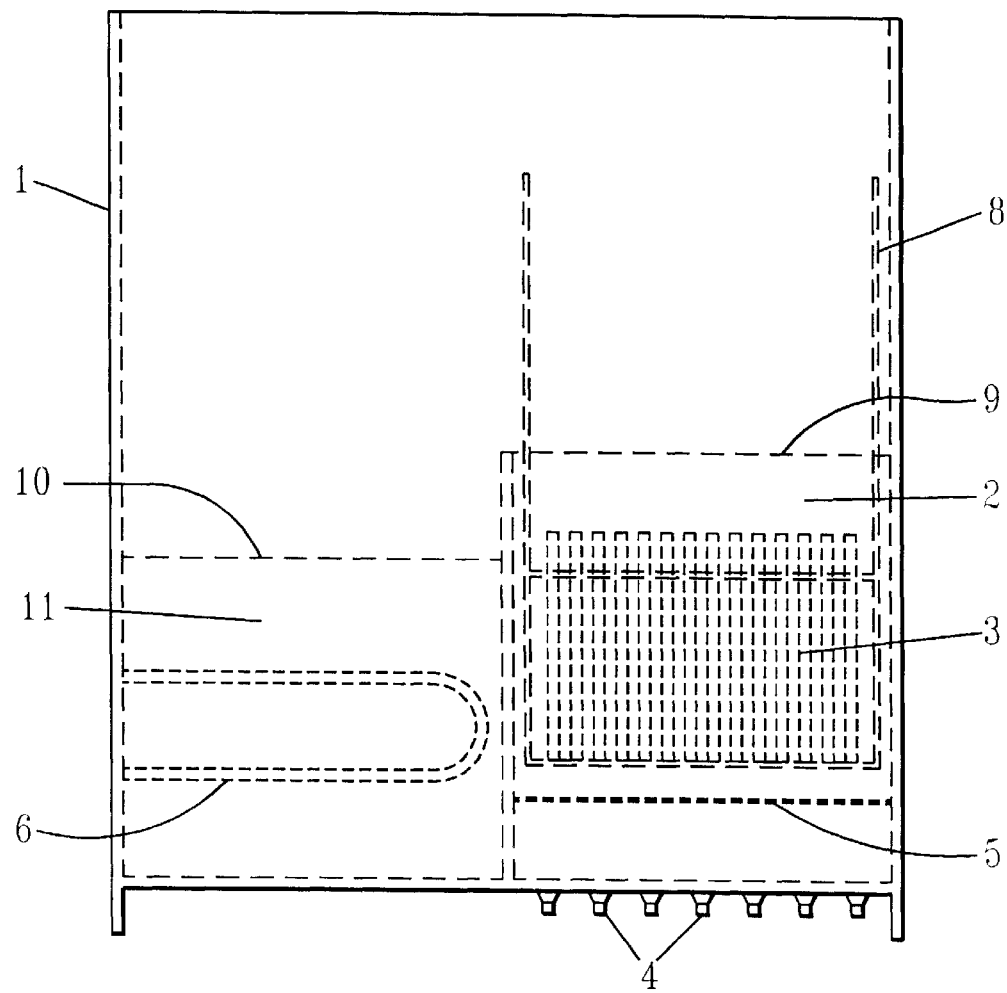
FIG. 1 is a schematic cross sectional front view of the device of the present invention.
Figure 2:
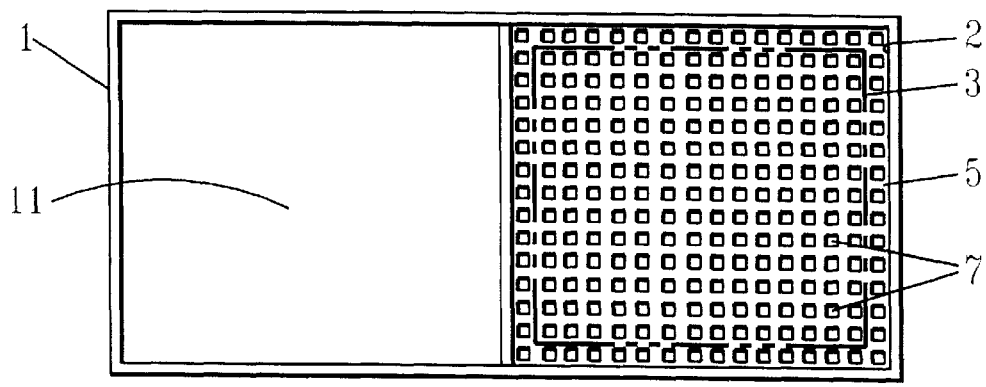
FIG. 2 is a schematic top view of the screen employed according to the present invention.

To facilitate an understanding of the present invention, reference will be made to FIGS. 1 and 2. FIG. 1 is a schematic diagram of apparatus according to the present invention, wherein numeral 1 represents the housing of the apparatus. a typical material for the housing 1 is 3/16" stainless steel. Contained within housing 1 is a chamber 2 which in typical configuration is in the form of a wire basket providing access for the treating fluid. Included in the chamber is means for suspending the articles 3 to be pretreated by fluid in the chamber 2. Located adjacent chamber 2 are ultrasonic transducers 4 for imparting ultrasonic waves through fluid when present in the chamber for impinging on articles 3 to be treated. The ultrasonic transducers are typically in the form of hors as disclosed in U.S. Pat. No. 5,512,335, disclosure of which being incorporated herein by reference. The ultrasonic transducers are typically operated at power of about 10 to 50 kilohertz, a specific example being 40 kilohertz at 960 watts. The transducers 4 in FIG. 1 are shown as being located beneath chamber 2, but can be located elsewhere adjacent chamber 2 such as on the side of chamber 2.

A screen 5 is located intermediate the transducers 4 and articles 3 to be treated. As illustrated in FIG. 1, screen 5 is located in the vicinity of the bottom of chamber 2. However, it being understood that when transducers 4 are located in a different position, such as adjacent a side of chamber 2, then screen 5 will likewise be relocated so that it is intermediate the transducers 4 and articles 3 being treated. In a typical arrangement, the transducers 4 are located about 3 inches from the articles 3 being treated and the screen 5 is located about 2 inches from the transducers 4 and one inch from the articles 3 being treated.

The screen 5 is of a material that will not be adversely effected to undesired extent by the treating fluid and typically is stainless steel since it resists corrosion. Typically, the screen has openings of about 0.03 to about 0.07 inches, a specific example being about 400 mesh stainless steel screen. The thickness of the screen is typically 0.015 to about 0.018 inches. The specific screen employed contained square-shaped holes or openings 7 (see FIG. 2). FIG. 2 is a view looking downward on the screen located in the vicinity of the bottom of tank 2 as shown in FIG. 1. Numeral 3 represents a part being treated.

According to the present invention, it is essential that the screen contain a coating 8 of a dielectric material on both major surfaces thereof. The dielectric coated screen diffuses the ultrasonic waves and absorbs some of the energy imparted from the waves thereby rendering the treatment more uniform and significantly reducing, if not eliminating, "hot spots". Moreover, the energy imparted to the article remains at a level adequate for treating the article.

By way of example, the perchloroethylene degreaser, used to deflux substrates after soldering, was damaging or destroying solder joints. The ultrasonic horns across the bottom of the device focused energy, creating hot spots, thereby causing solder joints to be pitted. Attempts to overcome this problem by placing an uncoated stainless steel screen in the bottom of the treatment chamber failed to alleviate this problem. The uncoated stainless steel screen merely permitted the energy to bounce or reflect to another area of the degreaser, resulting also in defective solder joints. On the other hand, the dielectric coated screens employed according to the present invention significantly reduced if not entirely reduced "hot spots".

The coating is typically from about 5 to about 25 microns thick and more typically about 6 to about 10 microns thick, a specific example being 8 microns thick.

The dielectric coating should be resistant to the treating fluid and exhibit good adhesion to the underlying screen substrate. Examples of some dielectric materials include thermoplastic and thermosetting resins. Typical thermosetting resinous materials include polyimides, epoxy, phenolic-based materials and polyamides. Examples of some phenobic-type materials include copolymers of phenol, resorcinol and cresol. Examples of some suitable thermoplastic polymeric materials include polyolefins such as polypropylene, polysulfones, polycarbonates, nitride rubbers and ABS polymers.

The preferred coatings are polyimides. The polyimides that can be used in accordance with the present invention include unmodified polyimides, as well as modified polyimides such as polyester imides, polyamide-imide-esters, polyamide-imides, polysiloxane-imides, as well as other mixed polyimides. Such are well known in the prior art and need not be described in any great detail.

Generally, the polyimides include the following recurring unit:

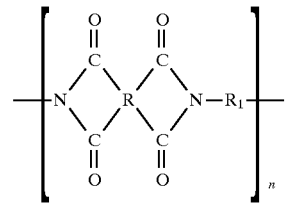

where n is an integer representing the number of repeating units to provide a molecular weight usually about 10,000 to about 100,000. R is at least one tetravalent organic radical selected from the group consisting of:

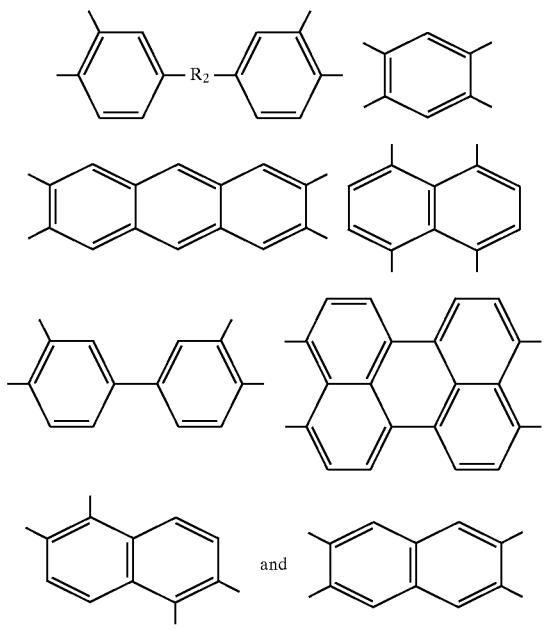

$R_2$ being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which $R_1$ is at least one divalent radical selected from the group consisting of an aliphatic organic radical or from the group shown:

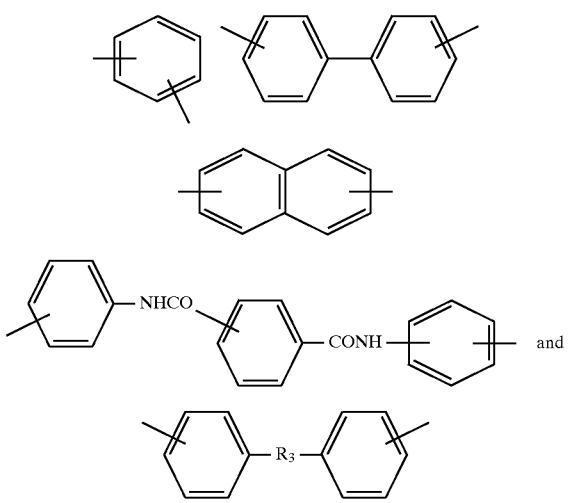

in which $R_3$ is a divalent organic radical selected from the group consisting of $R_2$, silico, and amino radicals. Polymers containing two or more of the R and/or $R_1$ radicals, especially multiple series of $R_1$ containing amido radicals, can be used.

Polyimides are available commercially from a variety of suppliers in one of three forms: a) as solutions of the polyamic acid precursors (e.g. DuPont Pyralin®; b) as pre-imidized polyimide film (e.g. DuPont Kapton® film); or c) as pre-imidized powders (e.g. Ciba-Geigy Matrimid 5218®) or solutions (e.g. Ciba-Geigy Probimide). Preferred polyimides for use in the present invention are based on the monomers pyromellitic dianhydride (PMDA) and oxydianiline (ODA, also named 4,4'-diaminodiphenyl ether). Other preferred polyimides for use pursuant to the present invention are the polymers of benzophenonetetracarboxylic dianhydride (BTDA) and ODA and/or 1,3-phenylenediamine and the polymer of 3,3'-biphenylenetetracarboxylic acid (BPDA) and 1,4-phenylenediamine (PDA). Polyimide films based on PMDA-ODA are available from Allied Corporation under the tradename Apical® and from DuPont under the tradename Kapton®. Films based on BPDA-PDA are available from Ube Corporation as Upilex® and from Hitachi Chemical Company as PIQL100. Other tradename polyimides useful pursuant to the present invention include Durimid® from Rogers Corporation and the DuPont Pyralin® series, including PI2525, PI 5878 and PI-2566.

In this disclosure, there are shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. A fluid treating device comprising a housing defining at least one chamber therein;
   means for suspending in said at least one chamber articles to be treated by said treating device;
   a plurality of ultrasonic transducers located adjacent said chamber for imparting ultrasonic waves through fluid when present in said chamber for impinging on the articles to be treated; and
   a screen located in said chamber intermediate said ultrasonic transducers and said means for suspending, wherein said screen is coated with a dielectric material to thereby diffuse the ultrasonic waves and enhance uniform treatment of the articles.

2. The fluid treating device of claim 1 wherein said screen is stainless steel.

3. The fluid treating device of claim 1 wherein said screen has openings of about 0.03 to about 0.07 inches.

4. The fluid treating device of claim 1 wherein said screen is a 400 mesh screen.

5. The fluid treating device of claim 1 wherein the thickness of said screen is about 0.015 to about 0.018 inches.

6. The fluid treating device of claim 1 wherein the thickness of the coating is about 5 to about 25 microns.

7. The fluid treating device of claim 1 wherein the thickness of the coating is about 60 to about 10 microns.

8. The fluid treating device of claim 1 wherein said transducers are in the form of horns.

9. The fluid treating device of claim 1 wherein said coating includes a polyimide.

10. The fluid treating device of claim 1 wherein said transducers are located beneath said chamber and said screen is located within the vicinity of the bottom of said chamber.

11. A method for treating an article with fluid, which method comprises:
    providing a housing defining at least one chamber therein;
    providing fluid to said chamber;
    suspending the article to be treated in said chamber;
    providing a plurality of ultrasonic transducers adjacent said chamber for imparting ultrasonic waves through said fluid for impinging on the article to be treated; and
    diffusing said ultrasonic waves for enhancing uniform treatment of the article by providing a screen in said chamber intermediate said ultrasonic transducers and said article, wherein said screen is coated with a dielectric material.

12. The method of claim 11 wherein said screen is stainless steel.

13. The method of claim 11 wherein said screen has openings of about 0.03 to about 0.07 inches.

14. The method of claim 11 wherein said screen is a 400 mesh screen.

15. The method of claim 11 wherein the thickness of said screen is about 0.015 to about 0.018 inches.

16. The method of claim 11 wherein the thickness of said coating is about 5 to about 25 microns.

17. The method of claim 11 wherein the thickness of the coating is about 6 to about 10 microns.

18. The method of claim 11 wherein said coating includes a polyimide.

19. The method of claim 11 wherein said transducers are located beneath said chamber and said screen is located within the vicinity of the bottom of said chamber.

20. The method of claim 11 wherein said fluid is perchloroethylene and said article includes a ceramic substrate.

* * * * *